United States Patent
Niimi et al.

(10) Patent No.: US 7,345,001 B2
(45) Date of Patent: Mar. 18, 2008

(54) GATE DIELECTRIC HAVING A FLAT NITROGEN PROFILE AND METHOD OF MANUFACTURE THEREFOR

(75) Inventors: Hiroaki Niimi, Dallas, TX (US); Husam N. Alshareef, Austin, TX (US); Rajesh Khamankar, Coppell, TX (US); Toan Tran, Rowlett, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/875,482

(22) Filed: Jun. 24, 2004

(65) Prior Publication Data
US 2005/0285211 A1    Dec. 29, 2005

(51) Int. Cl.
*H01L 29/72* (2006.01)

(52) U.S. Cl. ............ 438/776; 438/197; 438/275; 438/579; 438/775; 438/777

(58) Field of Classification Search .............. 438/197, 438/275, 579, 775, 776, 777
See application file for complete search history.

(56) References Cited

U.S. PATENT DOCUMENTS

| 5,288,527 A * | 2/1994 | Jousse et al. ............... 427/579 |
| 6,096,590 A * | 8/2000 | Chan et al. ................ 438/233 |
| 6,503,846 B1 * | 1/2003 | Niimi et al. ............... 438/776 |
| 6,667,251 B2 * | 12/2003 | McFadden et al. ......... 438/795 |
| 6,730,566 B2 * | 5/2004 | Niimi et al. ............... 438/275 |

\* cited by examiner

*Primary Examiner*—Edward Wojciechowicz
(74) *Attorney, Agent, or Firm*—Jacqueline J. Garner; W. James Brady, III; Frederick J. Telecky, Jr.

(57) ABSTRACT

The present invention provides a gate dielectric having a flat nitrogen profile, a method of manufacture therefor, and a method of manufacturing an integrated circuit including the flat nitrogen profile. In one embodiment, the method of manufacturing the gate dielectric includes forming a gate dielectric layer (410) on a substrate (310), and subjecting the gate dielectric layer (410) to a nitrogen containing plasma process (510), wherein the nitrogen containing plasma process (510) has a ratio of helium to nitrogen of 3:1 or greater.

13 Claims, 5 Drawing Sheets

GATE DIELECTRIC HAVING A FLAT NITROGEN PROFILE AND METHOD OF MANUFACTURE THEREFOR

CROSS-REFERENCE TO RELATED APPLICATION

This Application claims the benefit of U.S. Provisional Application Ser. No. 60/482,194 filed on Jun. 24, 2003, entitled "METHOD FOR FORMULATION OF ULTRATHIN HOMOGENOUS SILICON OXYNITRIDE GATE DIELECTRIC USING He/N2 PLASMA", commonly assigned with the present invention and incorporated herein by reference.

TECHNICAL FIELD OF THE INVENTION

The present invention is directed, in general, to a gate dielectric and, more specifically, to a gate dielectric having a flat nitrogen profile and a method of manufacture therefor.

BACKGROUND OF THE INVENTION

The trend in semiconductor technology to double the functional complexity of its products every 18 months (Moore's "law"), which is still valid today after having dominated the industry for the last three decades, has several implicit consequences. First, the cost per functional unit should drop with each generation of complexity so that the cost of the product with its doubled functionality would increase only slightly. Second, the higher product complexity should largely be achieved by shrinking the feature sizes of the chip components while holding the package dimensions constant; preferably, even the packages should shrink. Third, the increased functional complexity should be paralleled by an equivalent increase in reliability of the product. And fourth, but not least, the best financial profit rewards were held out for the ones who were ahead in the marketplace in reaching the complexity goal together with offering the most flexible products for application.

The scaling of the components in the lateral dimension requires vertical scaling as well so as to achieve adequate device performance. This vertical scaling requires the thickness of the gate dielectric, commonly silicon dioxide ($SiO_2$) to be reduced. Thinning of the gate dielectric provides a smaller barrier to dopant diffusion from a polysilicon gate structure (or metal diffusion from a metal gate structure) through the underlying dielectric, often resulting in devices with diminished electrical performance and reliability. In ultra-thin dielectric layers, interfaces with their unwelcome electronic states and carrier traps may finally dominate the electrical characteristics.

One way of reducing these problems is to use silicon nitride as the gate dielectric layer instead of silicon dioxide. Silicon nitride has a higher dielectric constant than typical thermally grown $SiO_2$ and provides greater resistance to impurity diffusion. However, the electrical properties of standard deposited silicon nitride films are far inferior to thermal oxides. One approach for silicon nitride films as gate insulators employs an oxide layer between the nitride layer and the substrate. Unfortunately, this technique has numerous practical shortcomings.

Another approach of maintaining the benefit of the electrical properties of the oxide film while also getting the barrier properties of a nitride film is to incorporate nitrogen into a gate oxide layer. In known technology, this is accomplished by a nitrided oxide process involving ammonia to penetrate the gate oxide at temperatures in excess of 1000° C. Once the high temperature reaction has begun, it is difficult to control the concentration of the nitrogen incorporated into the gate oxide. Excessive nitrogen near the interface between the semiconductor substrate and the gate oxide can adversely affect the threshold voltage and degrade the channel mobility of the device due to charged interface traps associated with the nitrogen.

As described by S. V. Hattangady et al., "Controlled Nitrogen Incorporation at the Gate Oxide Surface," Appl. Phys. Lett. vol. 66. p. 3495, 1995, a high pressure and low power process provides nitrogen incorporation specifically at the gate/conductor interface. The long exposure time to the plasma increases the probability of charge-induced damage to the oxide and reduces the production throughput.

In U.S. Pat. No. 6,136,654, issued on Oct. 24, 2000 (Kraft et al., "Method of Forming Thin Silicon Nitride or Silicon Oxynitride Gate Dielectrics"), the $SiO_2$ (or oxynitride) layer is subjected to a nitrogen containing plasma so that the nitrogen is either incorporated into the $SiO_2$ layer or forms a nitride layer at the surface of the substrate. The source of nitrogen in the plasma comprises a material consisting of $N_2$, $NH_3$, NO, $N_2O$, or mixtures thereof. This method provides a non-uniform nitrogen distribution in the $SiO_2$ layer and is applicable to relatively thick oxide layers (2 to 15 nm), however, it is not suitable for ultra-thin $SiO_2$ layers (0.5 to 2 nm).

An urgent need has, therefore, arisen for a coherent, low-cost method of plasma nitridation of ultra-thin gate oxide layers. The method should further produce excellent electrical device performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

To address the above-discussed deficiencies of the prior art, the present invention provides a gate dielectric having a flat nitrogen profile, a method of manufacture therefor, and a method of manufacturing an integrated circuit including the flat nitrogen profile. In one embodiment, the method of manufacturing the gate dielectric includes forming a gate dielectric layer on a substrate, and subjecting the gate dielectric layer to a nitrogen containing plasma process, wherein the nitrogen containing plasma process has a ratio of helium to nitrogen of 3:1 or greater.

Additionally, the present invention provides a semiconductor device. The semiconductor device includes: (1) a gate dielectric layer located on a substrate, the gate dielectric layer having nitrogen included therein, wherein a concentration of the nitrogen in the gate dielectric layer varies by less than about 10% throughout the depth, and (2) a gate electrode located over the gate dielectric layer.

Further included within the present invention is a method of manufacturing an integrated circuit including the gate dielectric. In addition to that disclosed above, the method for forming the integrated circuit includes forming an interlevel dielectric layer having interconnects located therein over the gate structure, wherein the interconnects contact the semiconductor device to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
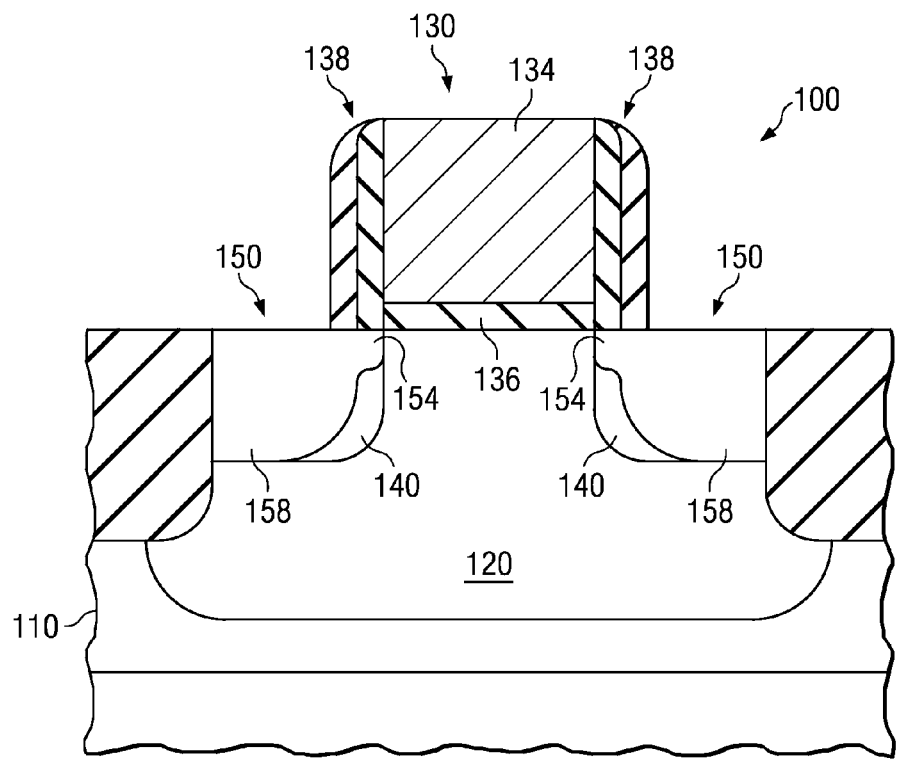
FIG. 1 illustrates a cross-sectional view of one embodiment of a semiconductor device constructed according to the principles of the present invention.

Referring initially to FIG. 1, illustrated is a cross-sectional view of one embodiment of a semiconductor device 100 constructed according to the principles of the present invention. In the embodiment illustrated in FIG. 1, the semiconductor device 100 includes a substrate 110. Located within the substrate 110 in the embodiment of FIG. 1 is a well region 120. In the illustrative embodiment of FIG. 1, a gate structure 130, including a gate 134 electrode, a gate dielectric layer 136, and gate sidewall spacers 138, is located over the substrate 110.

The gate dielectric layer 136, when manufactured in accordance with the principles of the present invention, includes nitrogen therein. For instance, in one embodiment of the invention the gate dielectric layer 136 is a silicon oxynitride gate dielectric layer. In contrast to silicon oxynitride gate dielectric layers of the prior art, the gate dielectric layer 136 has a concentration of nitrogen that varies by less than about 10% across the thickness (e.g., depth) thereof.

Figure 2:
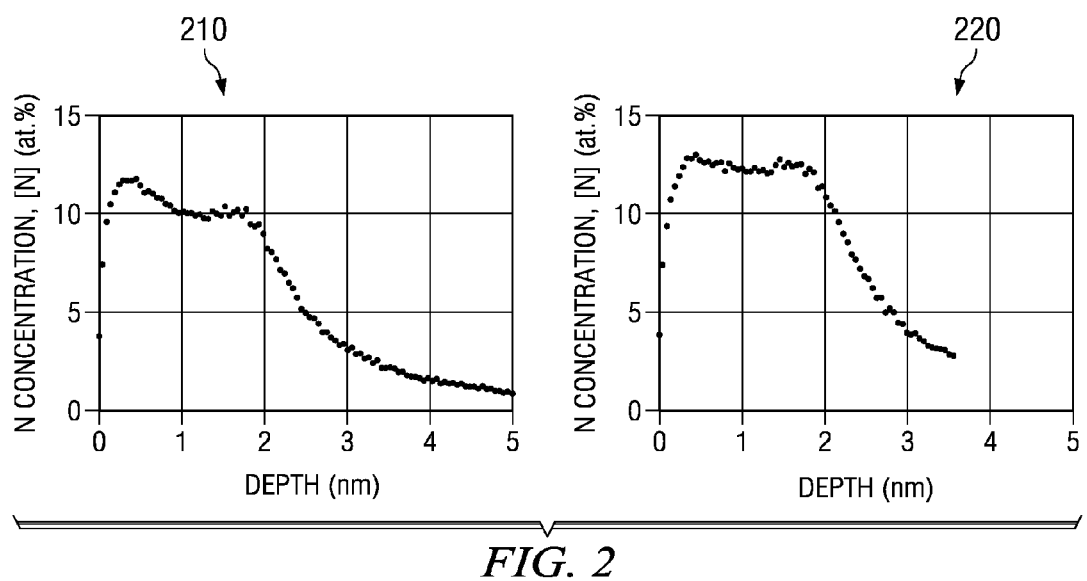
FIG. 2 illustrates two graphs, each representing the nitrogen concentration per unit depth for a device manufactured using the prior art method and a device manufactured in accordance with the principles of the present invention, respectively.

Turning briefly to FIG. 2, illustrated are two graphs 210, 220, each representing the nitrogen concentration per unit depth for a device manufactured using the prior art method and a device manufactured in accordance with the principles of the present invention, respectively. Notice the large swing in nitrogen concentration that exists across the thickness of the gate dielectric layer in the first graph 210, which represents a gate dielectric layer manufactured using the prior art method. In comparison, notice the small swing in nitrogen concentration that exists across the thickness of the gate dielectric layer in the second graph 220, which represents a device manufactured in accordance with the principles of the present invention. Thus, the manufacturing method of the present invention provides a substantially consistent nitrogen concentration along the entire thickness of the gate dielectric layer. The aforementioned consistent nitrogen concentration is particularly beneficial in gate dielectric layer thicknesses of about 2.5 nm or less, and more particularly thicknesses ranging from about 2.5 nm to about 1.5 nm, such as illustrated in FIG. 1.

Turning back to FIG. 1, the semiconductor device 100 further includes halo implants 140 and conventional source/drain regions 150 located within the substrate 110. The source/drain regions 150, as is common, generally include a lightly doped source/drain implant 154 as well as a higher doped source/drain implant 158.

Figure 3:
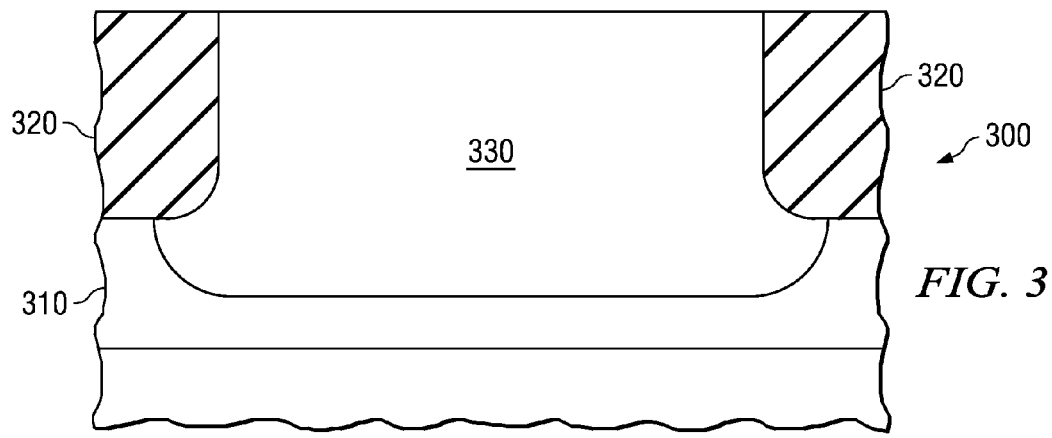
FIG. 3 illustrates a cross-sectional view of a partially completed semiconductor device.

Turning now to FIGS. 3-8, illustrated are cross-sectional views of detailed manufacturing steps instructing how one might, in an advantageous embodiment, manufacture a semiconductor device similar to the semiconductor device 100 depicted in FIG. 1. FIG. 3 illustrates a cross-sectional view of a partially completed semiconductor device 300. The partially completed semiconductor device 300 includes a substrate 310. The substrate 310 may, in an exemplary embodiment, be any layer located in the partially completed semiconductor device 300, including a wafer itself or a layer located above the wafer (e.g., epitaxial layer). In the embodiment illustrated in FIG. 3, the substrate 310 is a P-type semiconductor substrate; however, one skilled in the art understands that the substrate 310 could be an N-type substrate without departing from the scope of the present invention. In such a case, each of the dopant types described throughout the remainder of this document would be reversed. For clarity, no further reference to this opposite scheme will be discussed.

Located within the substrate 310 in the embodiment shown in FIG. 3 are shallow trench isolation regions 320. The shallow trench isolation regions 320 isolate the semiconductor device 300 from other devices located proximate thereto. As those skilled in the art understand the various steps used to form these conventional shallow trench isolation regions 320, no further detail will be given.

In the illustrative embodiment of FIG. 3, also formed within the substrate 310 is a well region 330. The well region 330, in light of the P-type semiconductor substrate, would more than likely contain an N-type dopant. For example, the well region 330 would likely be doped with an N-type dopant dose ranging from about 1E13 atoms/cm$^2$ to about 1E14 atoms/cm$^2$ and at a power ranging from about 100 keV to about 500 keV. What generally results is the well region 330 having a peak dopant concentration ranging from about 5E17 atoms/cm$^3$ to about 1E19 atoms/cm$^3$. As those skilled in the art are well aware of the steps generally used to form the well regions 330, no further details will be given.

Figure 4:
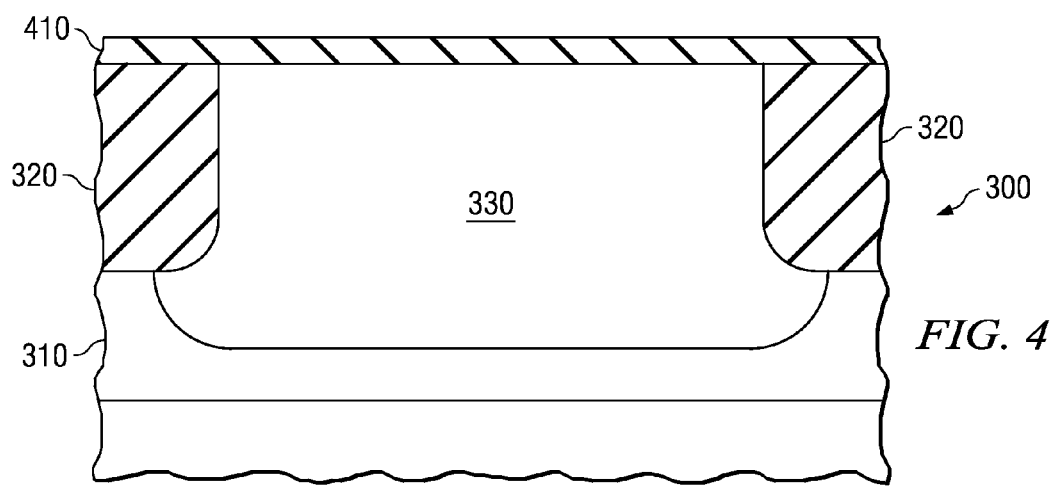
FIG. 4 illustrates a cross-sectional view of the partially completed semiconductor device illustrated in FIG. 3 after formation of a gate dielectric layer on the substrate.

Turning now to FIG. 4, illustrated is a cross-sectional view of the partially completed semiconductor device 300 illustrated in FIG. 3 after formation of a gate dielectric layer 410 on the substrate 310. In an exemplary embodiment of the invention the gate dielectric layer 410 has a thickness of less than about 2.5 nm, and more particularly a thickness ranging from about 2.5 nm to about 1.5 nm. While the thickness of the gate dielectric layer 410 in the embodiment of FIG. 3 is relatively small, those skilled in the art understand that the gate dielectric layer 410 thickness may be much larger than the 2.5 nm discussed, while staying within the scope of the present invention.

The gate dielectric layer 410, which happens to be a silicon dioxide gate dielectric layer in the disclosed embodiment, in the exemplary embodiment of FIG. 3 is thermally grown. The thermal growth allows for a high quality appropriate thickness gate dielectric layer 410 to be formed. While thermal growth is disclosed, those skilled in the art understand that a deposition process might also be used.

Figure 5:
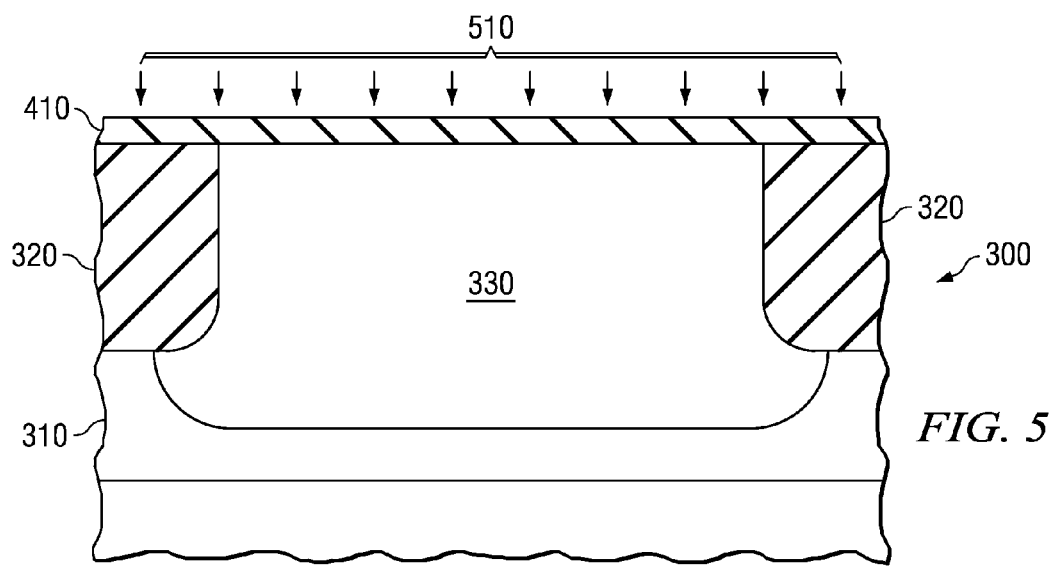
FIG. 5 illustrates a cross-sectional view of the partially completed semiconductor device illustrated in FIG. 4 after subjecting the gate dielectric layer to a nitrogen containing plasma process.

Turning now to FIG. 5, illustrated is a cross-sectional view of the partially completed semiconductor device 300 illustrated in FIG. 4 after subjecting the gate dielectric layer 410 to a nitrogen containing plasma process 510. Unique to the present invention, the nitrogen containing plasma process 510 has a ratio of helium to nitrogen of about 3:1 or greater. In an exemplary embodiment, the ratio is up to about 9:1 or greater and in an even more exemplary embodiment the ratio is about 19:1 or greater. As disclosed above, the high amounts of helium cause the nitrogen concentration in the gate dielectric layer 410 per unit depth to be substantially identical throughout the thickness. In the embodiment shown, the nitrogen concentration varies by less than about 10%.

The nitrogen, as those skilled in the art appreciate, may be supplied by a number of different sources. For instance, in one exemplary embodiment of the invention the nitrogen is supplied using nitrogen gas (N$_2$). In other embodiment of the invention, however, the nitrogen may be supplied using a source selected from the group consisting of NH$_3$, NO, N$_2$O, or mixtures thereof. Other nitrogen sources may nonetheless also be used.

While it is believed that the most important parameter of the nitrogen containing plasma process 510 is the ratio of helium to nitrogen, other process parameters are also important. For example, a low pressure is desired. In one embodiment this low pressure is less than about 20 mTorr, and in another embodiment the pressure ranges from about 20 mTorr to about 10 mTorr. Similarly, the RF power and temperature may be tailored. For instance the RF power may range from about 1000 watts to about 300 watts and the temperature may range from about room temperature to about 500° C. While specific ranges have been given for pressure, power and temperature, other pressures, powers and temperatures outside of the disclosed ranges may obviously be used.

After completing the nitrogen containing plasma process 510, the gate dielectric layer 410 may be subjected to an anneal. This anneal, which may include temperatures ranging from about 900° C. to about 1200° C. for a time period ranging from about 5 seconds to about 60 seconds, is designed to stabilize the nitrided oxide and minimize nitrogen out-diffusion. Other temperatures and times could nonetheless be used for the anneal.

Figure 6:
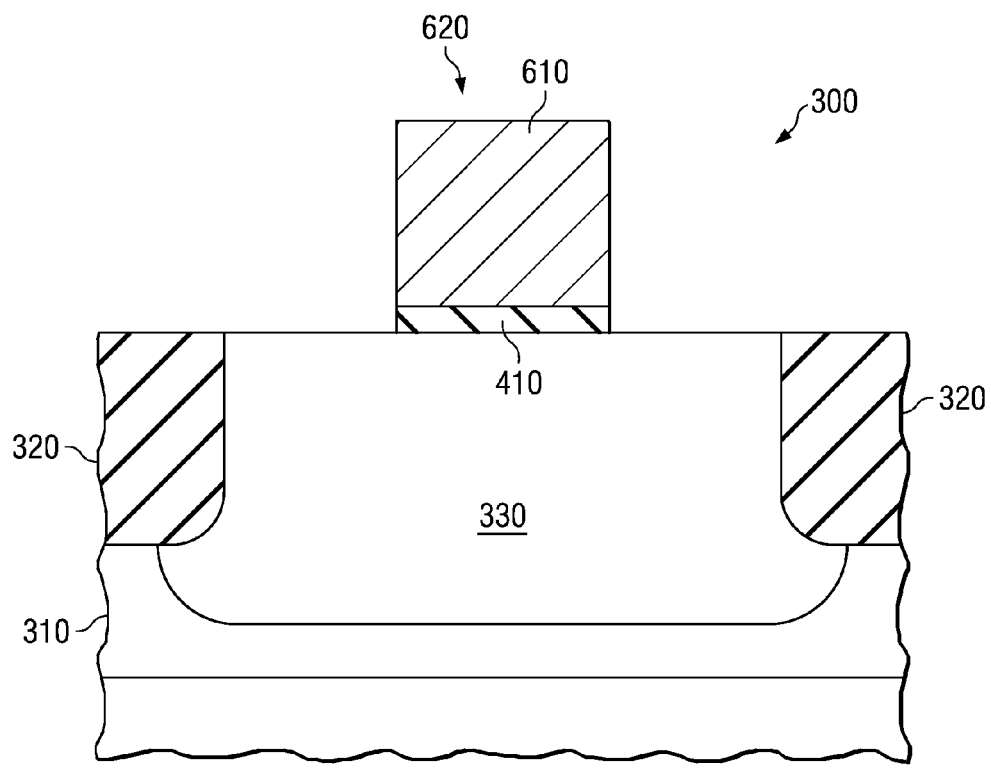
FIG. 6 illustrates a cross-sectional view of the partially completed semiconductor device illustrated in FIG. 5 after forming a gate electrode layer over the gate dielectric layer, and patterning the gate dielectric layer and gate electrode layer to form a gate structure.

Turning now to FIG. 6, illustrated is a cross-sectional view of the partially completed semiconductor device 300 illustrated in FIG. 5 after forming a gate electrode layer 610 over the gate dielectric layer 410, and patterning the gate dielectric layer 410 and gate electrode layer 610 to form a gate structure 620. As the gate structure 620, but for the unique nitrogen containing plasma process, is conventional, those skilled in the art understand the standard steps used for its manufacture, including using photolithography to define the gate structure 620.

Figure 7:
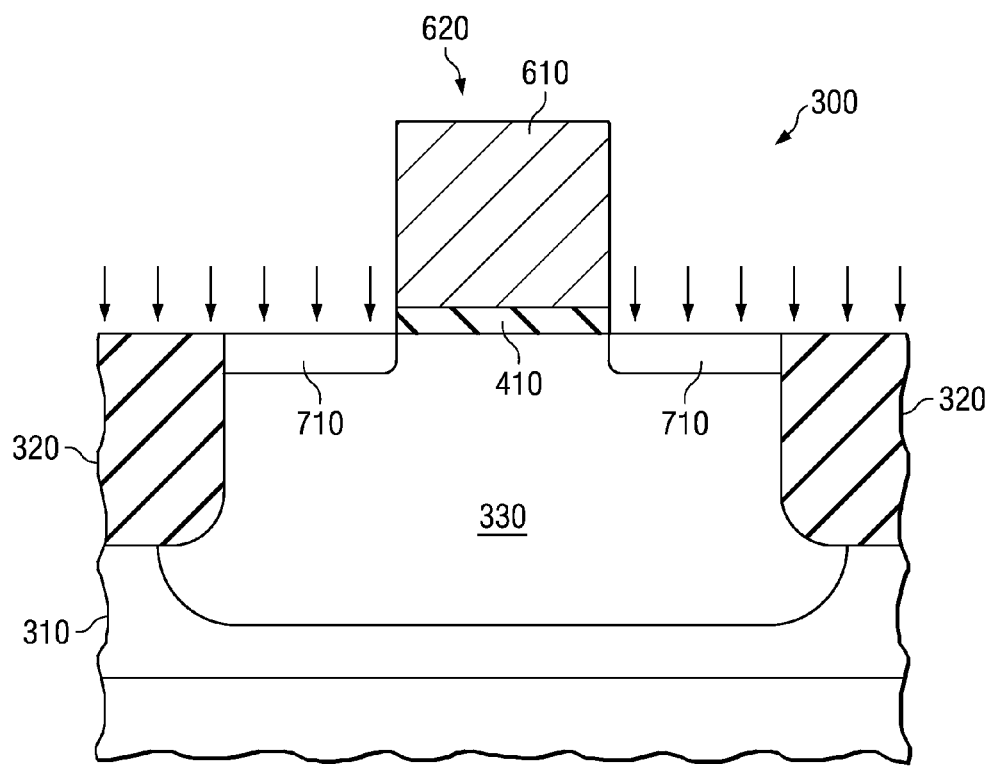
FIG. 7 illustrates a cross-sectional view of the partially completed semiconductor device illustrated in FIG. 6 after formation of lightly doped source/drain implants within the substrate.

Turning now to FIG. 7, illustrated is a cross-sectional view of the partially completed semiconductor device 300 illustrated in FIG. 6 after formation of lightly doped source/drain implants 710 within the substrate 310. The lightly doped source/drain implants 710 are conventionally formed and generally have a peak dopant concentration ranging from about 1E19 atoms/cm$^3$ to about 2E20 atoms/cm$^3$. As is standard in the industry, the lightly doped source/drain implants 710 have a dopant type opposite to that of the well region 330 they are located within. Accordingly, in the illustrative embodiment shown in FIG. 7, the lightly doped source/drain implants 710 are doped with a P-type dopant.

Figure 8:
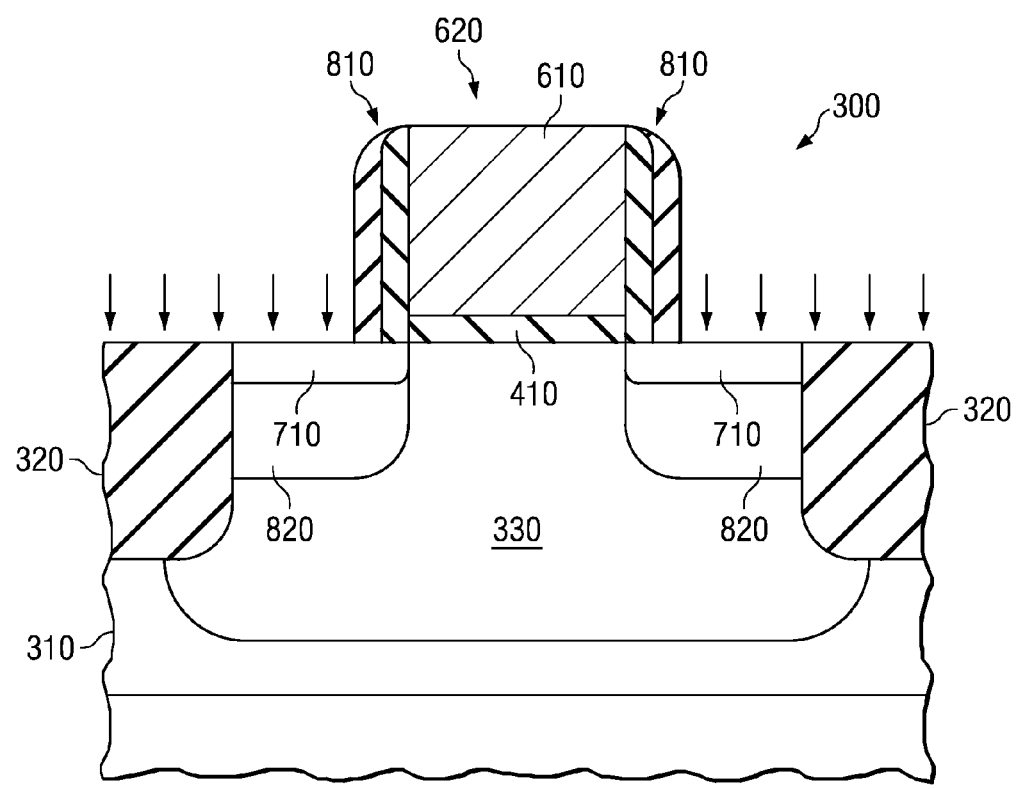
FIG. 8 illustrates a cross-sectional view of the partially completed semiconductor device illustrated in FIG. 7 after formation of conventional gate sidewall spacers and after placing halo implants within the substrate.

Turning now to FIG. 8, illustrated is a cross-sectional view of the partially completed semiconductor device 300 illustrated in FIG. 7 after formation of conventional gate sidewall spacers 810 and after placing halo implants 820 within the substrate 310. The formation of the gate sidewall spacers 810 is conventional. Often the gate sidewall spacers 810 comprise an oxide material that has been anisotropically etched.

The halo implants 820, in the particular embodiment discussed herein, comprise an N-type dopant. For example, in the illustrative embodiment shown in FIG. 8, the halo implants 820 include a phosphorous or arsenic dopant and have a peak dopant concentration ranging from about 1E18 atoms/cm$^3$ to about 1E19 atoms/cm$^3$. While the particular dopant used and dopant concentration of the halo implants 820 have been given, those skilled in the art understand that the present invention should not be limited to such dopants and concentrations. The use and location of the halo implants 820 is particularly designed to reduce short channel effects in the semiconductor device 300.

Figure 9:
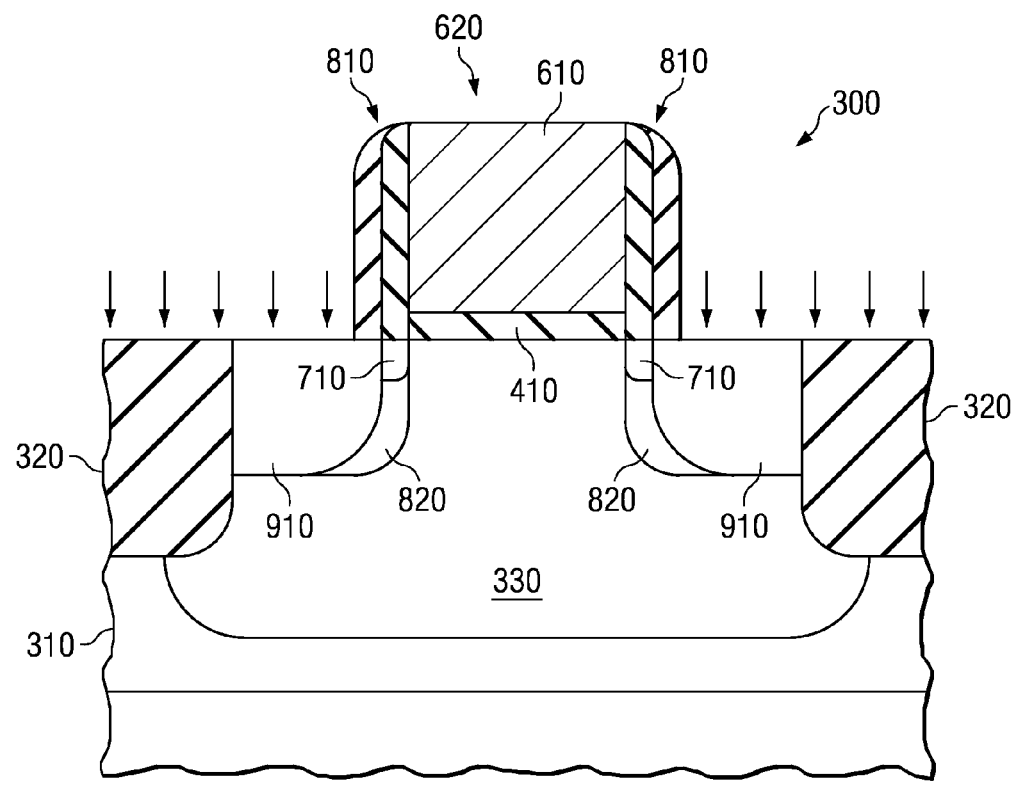
FIG. 9 illustrates a cross-sectional view of the partially completed semiconductor device illustrated in FIG. 8 after formation of highly doped source/drain implants within the substrate.

Turning now to FIG. 9, illustrated is a cross-sectional view of the partially completed semiconductor device 300 illustrated in FIG. 8 after formation of highly doped source/drain implants 910 within the substrate 310. The highly doped source/drain implants 910 are conventionally formed and generally have a peak dopant concentration ranging from about 1E18 atoms/cm$^3$ to about 1E21 atoms/cm$^3$. Also, the highly doped source/drain implants 910 should typically have a dopant type opposite to that of the well region 330 they are located within. Accordingly, in the illustrative embodiment shown in FIG. 9, the highly doped source/drain implants 910 are doped with a P-type dopant. What results after formation of the highly doped source/drain implants 910 is a device similar to the semiconductor device 100 illustrated in FIG. 1.

Figure 10:
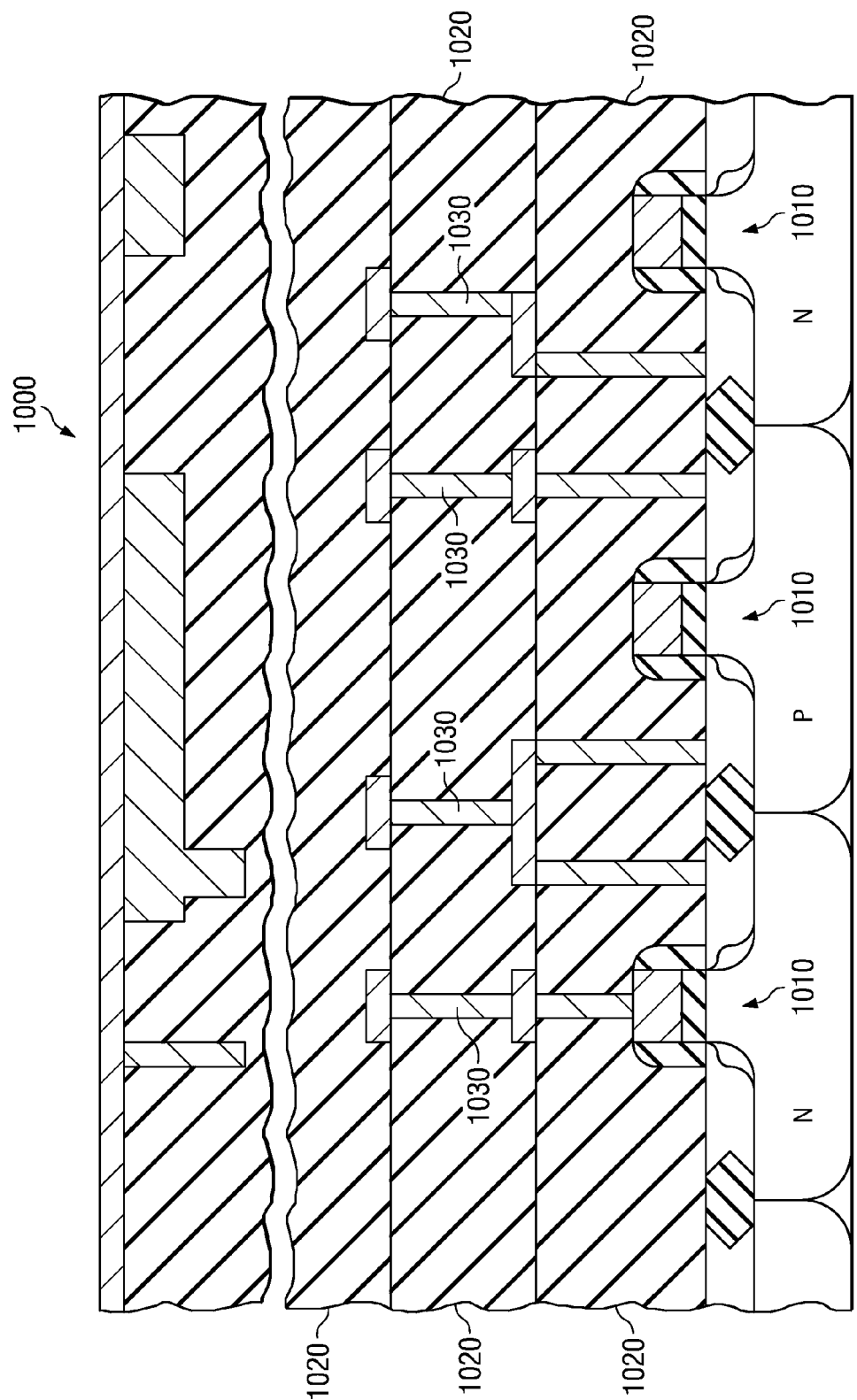
FIG. 10 illustrates a cross-sectional view of a conventional integrated circuit (IC) incorporating semiconductor devices constructed according to the principles of the present invention.

Referring finally to FIG. 10, illustrated is a cross-sectional view of a conventional integrated circuit (IC) 1000 incorporating semiconductor devices 1010 constructed according to the principles of the present invention. The IC 1000 may include devices, such as transistors used to form CMOS devices, BiCMOS devices, Bipolar devices, or other types of devices. The IC 1000 may further include passive devices, such as inductors or resistors, or it may also include optical devices or optoelectronic devices. Those skilled in the art are familiar with these various types of devices and their manufacture. In the particular embodiment illustrated in FIG. 10, the IC 1000 includes the semiconductor devices 1010 having dielectric layers 1020 located thereover. Additionally, interconnect structures 1030 are located within the dielectric layers 1020 to interconnect various devices, thus, forming the operational integrated circuit 1000.

Although the present invention has been described in detail, those skilled in the art should understand that they can make various changes, substitutions and alterations herein without departing from the spirit and scope of the invention in its broadest form.

What is claimed is:

1. A method of manufacturing a gate dielectric, comprising:
    forming a gate dielectric layer on a substrate; and
    subjecting the gate dielectric layer to a nitrogen containing plasma process, wherein the nitrogen containing plasma process has a ratio of helium to nitrogen of 19:1 or greater, thereby causing a concentration of nitrogen in the gate dielectric layer to be substantially uniform.

2. The method as recited in claim 1 wherein the gate dielectric layer has a thckness of 2.5 nm or less.

3. The method as recited in claim 1 wherein the gate dielectric layer has a thickness ranging from about 2.5 nm to about 1.5 nm.

4. The method as recited in claim 1 wherein the nitrogen is supplied using a source selected from the group consisting of $N_2$, $NH_3$, NO, $N_2O$, or mixtures thereof.

5. The method as recited in claim 1 wherein the concentration varies by less than about 10% in the gate dielectric layer.

6. The method as recited in claim 1 wherein subjecting the gate dielectric layer to a nitrogen containing plasma process includes subjecting the gate dielectric layer using a pressure of about 20 mTorr or less.

7. A method of manufacturing an integrated circuit, comprising:
    creating a semiconductor device, including;
        forming a gate dielectric layer on a substrate;
        subjecting the gate dielectric layer to a nitrogen containing plasma process, wherein the nitrogen containing plasma process has a ratio of helium to nitrogen of 19:1 or greater, thereby causing a concentration of nitrogen in the gate dielectric layer to be substantially uniform; and
        forming a gate electrode over the gate dieiectric layer; and
    constructing an interlevel dielectric layer over the semiconductor device and having interconnects located therein, wherein the interconnects contact the semiconductor device to form an operational integrated circuit.

8. The method as recited in claim 7 wherein the gate dielectric layer has a thickness of 2.5 nm or less.

9. The method as recited in claim 7 wherein the gate dielectric layer has a thickness ranging from about 2.5 nm to about 1.5 nm.

10. The method as recited in claim 7 wherein the nitrogen is supplied using a source selected from the group consisting of $N_2$, $NH_3$, NO, $N_2O$, or mixtures thereof.

11. The method as recited in claim 7 wherein a concentration of the nitrogen in the gate dielectric layer varies by less than about 10%.

12. The method as recited in claim 7 wherein subjecting the gate dielectric layer to a nitrogen containing plasma process includes subjecting the gate dielectric layer using a pressure of about 20 mTorr or less.

13. A method of manufacturing a gate dielectric, comprising:
    forming a gate dielectric layer on a substrate; and
    subjecting the gate dielectric layer to a nitrogen containing plasma process, wherein the nitrogen containing plasma process has a ratio of helium to nitrogen of 19:1 or greater and the nitrogen containing plasma process includes subjecting the gate dielectric layer using a pressure of less than 20 mTorr, thereby causing a concentration of nitrogen in the gate dielectric layer to be substantially uniform.

* * * * *